United States Patent
Huang et al.

(10) Patent No.: US 11,139,818 B1
(45) Date of Patent: Oct. 5, 2021

(54) FAST-LOCKING PHASE-LOCKED LOOP AND ASSOCIATED FAST-LOCKING METHOD THEREOF

(71) Applicant: MEDIATEK INC., Hsin-Chu (TW)

(72) Inventors: Po-Chun Huang, Hsinchu (TW); Yu-Li Hsueh, Hsinchu (TW); Chao-Ching Hung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/124,518

(22) Filed: Dec. 17, 2020

Related U.S. Application Data

(60) Provisional application No. 63/033,866, filed on Jun. 3, 2020.

(51) Int. Cl.
*H03L 7/10* (2006.01)
*H03L 7/093* (2006.01)

(52) U.S. Cl.
CPC .............. *H03L 7/10* (2013.01); *H03L 7/093* (2013.01)

(58) Field of Classification Search
CPC . H03L 7/085; H03L 7/093; H03L 7/10; H03L 7/101; H03L 7/102; H03L 7/103; H03L 7/104; H03L 7/105; H03L 7/107; H03L 7/1072; H03L 7/1075; H03L 7/1077; H03L 7/112; H03L 7/12
See application file for complete search history.

(56) References Cited

U.S. PATENT DOCUMENTS

| | | | |
|---|---|---|---|
| 6,441,660 B1 * | 8/2002 | Ingino, Jr. | ............ H03K 3/0315 327/156 |
| 6,504,437 B1 | 1/2003 | Nelson | |
| 6,897,690 B2 | 5/2005 | Keaveney | |
| 2006/0022726 A1 | 2/2006 | Maeda | |
| 2006/0135105 A1 | 6/2006 | Jensen | |
| 2014/0203853 A1 | 7/2014 | Hsueh | |

FOREIGN PATENT DOCUMENTS

| | | |
|---|---|---|
| EP | 1 387 495 A1 | 2/2004 |
| EP | 2 169 828 A1 | 3/2010 |

OTHER PUBLICATIONS

Johan F. Witte et al., Dynamic Offset Compensation Techniques, Dynamic Offset Compensated CMOS Amplifiers, Part of the Analog Circuits and Signal Processing book series, Springer Netherlands, 2009, pp. 13-42, XP055816713, 2009.
Cheng Ji et al., A CMOS APS Arrays with TDI in Analog Voltage Domain, PROC. of SPIE vol. 10244, 102440V, 2017 SPIE, pp. 1-6, XP060080470, 2017.

* cited by examiner

*Primary Examiner* — Diana J. Cheng
(74) *Attorney, Agent, or Firm* — Winston Hsu

(57) ABSTRACT

A fast-locking phase-locked loop (PLL) and an associated fast-locking method thereof are provided. The fast-locking PLL may include a gear-shifting loop filter, which is configured to have a dynamic bandwidth. The gear-shifting loop filter may include a resistor set and a capacitor set coupled to the resistor set, where the resistor set is configured to have a dynamic resistance, and the capacitor set is configured to have a dynamic capacitance. More particularly, the dynamic resistance is switched from a first resistance to a second resistance and the dynamic capacitance is switched from a first capacitance to a second capacitance, to make the dynamic bandwidth be switched from a first bandwidth to a second bandwidth.

20 Claims, 6 Drawing Sheets

FAST-LOCKING PHASE-LOCKED LOOP AND ASSOCIATED FAST-LOCKING METHOD THEREOF

CROSS REFERENCE TO RELATED APPLICATIONS

This application claims the benefit of U.S. provisional application No. 63/033,866, which was filed on Jun. 3, 2020, and is included herein by reference.

BACKGROUND

The present invention is related to phase-locked loop (PLL), and more particularly, to a fast-locking PLL and an associated fast-locking method thereof.

In order to implement a fast-locking PLL, at least one parameter of the fast-locking PLL can be configured to be variable. In a related art, a charge pump current of a PLL can be dynamically switched during a locking operation of this PLL, thereby accelerate the locking operation without sacrificing noise-related performance of the PLL. For example, at the beginning of the locking operation of the PLL, the charge pump current is controlled to have an initial current that is greater than a final current, where the initial current makes the locking operation faster but the noise-related performance is worse in comparison with having the final current; and when the locking operation is almost completed (e.g. output frequency of the PLL is close to a target frequency), the charge pump current can be controlled to have the final current, in order to guarantee the noise-related performance.

The manner of dynamically switching the charge pump current indeed improves the speed of the locking operation. There are some disadvantages, however. In general, a unit cell of a charge pump current source is designed to have a big size for better noise-related performance. When enhancing the speed of the locking operation, the number of unit cells has to be increased, and thereby greatly increase an overall circuit area and current consumption. Thus, there is a need for a novel mechanism for fast-locking operation and an associated architecture thereof, to implement a fast-locking PLL without introducing any side effect or in a way that is less likely to introduce side effects.

SUMMARY

This in mind, an objective of the present invention is to provide a fast-locking phase-locked loop (PLL) and an associated fast-locking method thereof, e.g. a fast-locking PLL based on gear-shifting loop filter for dynamic bandwidth control, which can implement a fast-locking operation without greatly increase additional costs.

At least one embodiment of the present invention provides a fast-locking PLL. The fast-locking PLL may comprise a gear-shifting loop filter which is configured to have a dynamic bandwidth. The gear-shifting loop filter may comprise a resistor set and a capacitor set coupled to the resistor set, wherein the resistor set is configured to have a dynamic resistance, and the capacitor set is configured to have a dynamic capacitance. For example, the dynamic resistance is switched from a first resistance to a second resistance and the dynamic capacitance is switched from a first capacitance to a second capacitance, to make the dynamic bandwidth be switched from a first bandwidth to a second bandwidth.

In addition to the above fast-locking PLL, at least one embodiment of the present invention provides a fast-locking method of a fast-locking PLL. The fast-locking method may comprise: utilizing a resistor set of a gear-shifting loop filter within the fast-locking PLL to control a dynamic resistance and utilizing a capacitor set of the gear-shifting loop filter to control a dynamic capacitance, to make the gear-shifting loop filter have a dynamic bandwidth; and switching the dynamic resistance from a first resistance to a second resistance, and switching the dynamic capacitance from a first capacitance to a second capacitance, to make the dynamic bandwidth be switched from a first bandwidth to a second bandwidth.

Embodiments of the present invention can enhance the speed of a locking operation of a PLL without sacrificing the noise-related performance by switching resistance and capacitance(s) of a loop filter within the PLL, which dynamically switches bandwidth of the loop filter during the locking operation. In addition, the embodiments of the present invention will not greatly increase additional costs. Thus, the present invention can improve overall performance without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
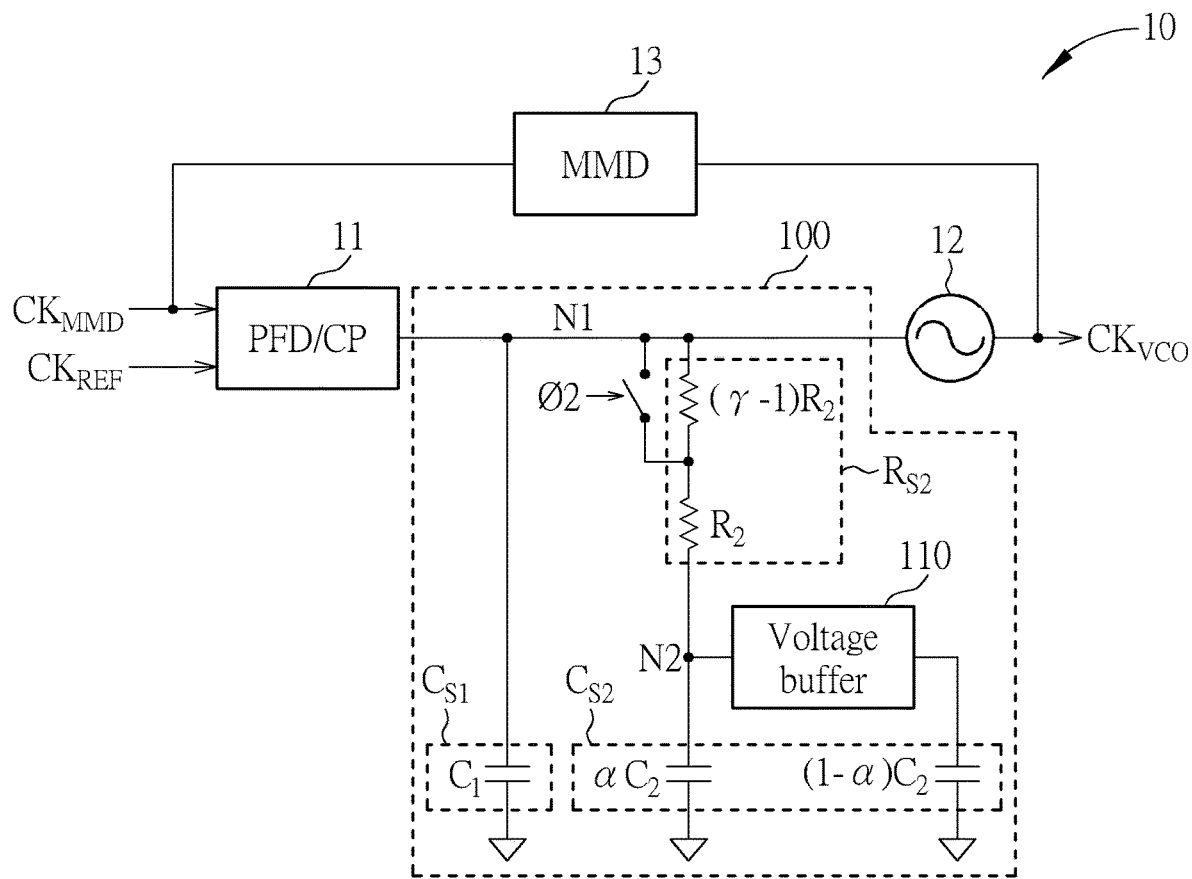
FIG. 1 is a diagram illustrating a fast-locking phase-locked loop (PLL) according to an embodiment of the present invention.

Certain terms are used throughout the following description and claims, which refer to particular components. As one skilled in the art will appreciate, electronic equipment manufacturers may refer to a component by different names.

This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

A phase-locked loop (PLL) may comprise a phase detector (e.g. a phase frequency detector), a charge pump, a loop filter, a voltage control oscillator (VCO) and a divider. In order to implement a fast-locking PLL, a gear-shifting bandwidth (e.g. a dynamic bandwidth) of the PLL can be employed. For example, the gear-shifting bandwidth can comprise a first bandwidth and a second bandwidth, which are sequentially adopted during a locking operation of the PLL. For example, the first bandwidth is adopted in a first mode, and the second bandwidth is adopted in a second mode following the first mode, where the first bandwidth benefits locking speed (e.g. arranged for locking frequency error and phase error) in comparison with the second bandwidth, and the second bandwidth can be designed for optimizing noise-related performance such as that related to integrated phase noise (IPN). For better illustration of a fast-locking operation of the PLL, please refer to the following equations, which present an open loop bandwidth (illustrated by "BWPLL(open loop)") K, a damping factor δ, and a close loop bandwidth ωn of the PLL:

$$BWPLL(openloop) = K \approx \frac{I_{CP} \times K_{VCO} \times R_P}{N};$$

$$\delta = \frac{R_P}{2}\sqrt{\frac{I_{CP} \times K_{VCO} \times C_P}{N}}; \text{ and}$$

$$\omega_n = \sqrt{\frac{I_{CP} \times K_{VCO}}{N \times C_P}}.$$

It should be noted that $I_{CP}$ represents a charge pump current of the charge pump, $K_{VCO}$ represents a VCO gain of the VCO, $R_P$ represents a resistance of a resistor within the loop filter, C represents a capacitance of a capacitor within the loop filter, and N represents a divisor of the divider. According to the above expressions, a method of changing a bandwidth (e.g. the open loop bandwidth K or the close loop bandwidth $\omega_n$) can be implemented by changing $I_{CP}$, $R_P$, $C_P$, $K_{VCO}$ and N. In general, the damping factor δ may be designed to be unchanged when varying the bandwidth between the first bandwidth and the second bandwidth.

For example, $I_{CP}$ in the first mode can be designed to be 2 times that in the second mode, and the first bandwidth can be √2 times the second bandwidth if the damping factor δ is unchanged (e.g. $R_P$ in the first mode is designed to be 1/√2 times that in the second mode). As a current source unit of the charge pump usually requires a large circuit area, the method of changing $I_{CP}$ for the gear-shifting bandwidth may greatly increase additional costs. Thus, the present invention provides another mechanism to implement the gear-shifting bandwidth. For example, $R_P$ in the first mode can be designed to be 2 times that in the second mode, and the first bandwidth can be 2 times the second bandwidth if the damping factor δ is unchanged (e.g. $C_P$ in the first mode is designed to be ¼ times that in the second mode).

FIG. 1 is a diagram illustrating a fast-locking PLL 10 according to an embodiment of the present invention, where the fast-locking PLL 10 may be an example of the aforementioned PLL. As shown in FIG. 1, the fast-locking PLL 10 may comprise a gear-shifting loop filter 100, a phase frequency detector with charge pump (which may be referred to as "PFD/CP" for brevity) 11, a voltage control oscillator (VCO) 12 and a divider such as a multi-modulus divider (MMD) 13. In this embodiment, the PFD/CP 11 may generate a voltage signal according to phase or frequency difference between a reference clock signal $CK_{REF}$ from a reference clock source (not shown) and a divided clock signal $CK_{MMD}$ from the MMD 13. This voltage signal may be transmitted to the VCO 12 via a path coupled to the gear-shifting loop filter. The VCO 12 then generates an output clock signal $CK_{VCO}$ according to the received voltage signal, and the MMD 13 may perform a frequency dividing operation upon the output clock signal $CK_{VCO}$, e.g. a frequency of the output clock signal $CK_{VCO}$ may be divided by a certain value (e.g. an integer of a fractional value greater than one), in order to generate the divided clock signal $CK_{MMD}$. It should be noted that embodiments of the present invention aim at providing implementations of the gear-shifting loop filter 100 (which will be described in detail later), where the other components such as the PFD/CP 11, the VCO 12 and the MMD 13 may be implemented or replaced by any suitable circuit architecture, and related details regarding to these components are omitted here for brevity. Furthermore, the architecture of the fast-locking PLL 10 shown in FIG. 1 is for illustrative purpose only, and is not meant to be a limitation of the present invention, that is, the gear-shifting loop filter 10 can be applied to any architecture of a fast-locking PLL which comprises a loop filter comprising resistors and/or capacitors.

In this embodiment, the gear-shifting loop filter 100 may be configured to have a dynamic bandwidth (e.g. either a bandwidth BW1 or a bandwidth BW2) in order to perform a gear-shifting operation (e.g. switching the dynamic bandwidth from the bandwidth BW1 to the bandwidth BW2). More specifically, the gear-shifting loop filter 100 may comprise a capacitor set $C_{S1}$, a resistor set $R_{S2}$ and a capacitor set $C_{S2}$ coupled to the resistor set $R_{S2}$. Assume that the bandwidth BW1 is designed to be γ times the bandwidth BW2 in the embodiment of FIG. 1, where γ is a positive value greater than one. In this embodiment, the resistor set $C_{S1}$ may be configured to have a fixed capacitance (e.g. implemented by a single capacitor $C_1$ having a capacitance "$C_1$", which is expressed by italics of the symbol "$C_1$"), the resistor set $R_{S2}$ may be configured to have a dynamic resistance (e.g. either a resistance "γ×$R_2$" or a resistance "$R_2$", which is expressed by italics of the symbol "$R_2$"), and the capacitor set $Cs_2$ may be configured to have a dynamic capacitance (e.g. either a capacitance "α×$C_2$" or a capacitance "$C_2$", which is expressed by italics of the symbol "$C_2$"), where α is preferably designed as 1/γ², but the present invention is not limited thereto. The dynamic resistance of the resistor set $R_{S2}$ and the dynamic capacitance of the capacitor set $C_{S2}$ may be examples of the resistance $R_P$ and the capacitance $C_P$ mentioned above, respectively. For example, the dynamic resistance of the resistor set $R_{S2}$ can be switched from "γ×$R_2$" to "$R_2$" and the dynamic capacitance of the capacitor set $C_{S2}$ can be switched from "α×$C_2$" to "$C_2$", to make the dynamic bandwidth be switched from the bandwidth BW1 to the bandwidth BW2.

In detail, the resistor set $R_{S2}$ is coupled between a first common node such as a node N1 and a second common node such as a node N2 of the gear-shifting loop filter 100. As shown in FIG. 1, the resistor set $R_{S2}$ may comprises a resistor (γ−1)$R_2$ (which has a resistance "(γ−1)×$R_2$" and a resistor $R_2$ (which has the resistance "$R_2$"), where the resistors $(\gamma-1)R_2$ and $R_2$ may be coupled in series, and a switch controlled by a gear-shifting control signal Ø2 is coupled across the resistors $(\gamma-1)R_2$, e.g. the dynamic resistance of the resistor set $R_{S2}$ can be switched from "$\gamma \times R_2$" to "$R_2$" by turning on this switch, but the present invention is not limited thereto. In some embodiments, the resistor set $R_{S2}$ having the dynamic resistance may be implemented by different way (e.g. a variable resistor, or multiple resistors with at least one switch for controlling connection of the multiple resistors). In addition, the capacitor set $Cs_2$ may comprise a capacitor $\alpha C_2$ (which has the capacitance "$\alpha \times C$") and a capacitor $(1-\alpha)C_2$ (which has a capacitance "$(1-\alpha) \times C_2$"), where the capacitor $\alpha C_2$ is coupled to the resistor set $R_{S2}$ via the node N2, and the dynamic capacitance of the capacitor set $Cs_2$ can be switched from "$\alpha \times C_2$" to "$C_2$" by coupling the capacitor $(1-\alpha)C_2$ to the node N2.

In some embodiment, the capacitor $(1-\alpha)C_2$ may be coupled to the node N2 without any processing in advance when performing the gear-shifting operation. This may cause some disadvantage, however. For example, when a locking operation of the fast-locking PLL 10 is almost completed, a voltage level on the node N2 is expected to be around a target level, where a voltage level on the capacitor $(1-\alpha)C_2$ may be different from that on the node N2, and therefore the voltage level on the node N2 may be pulled away from this target level when coupling the capacitor $(1-\alpha)C_2$ to the node N2. Under this condition, the locking operation will need to spend extra time for recovering the voltage level on the node N2 back to this target level via the bandwidth BW2. As the bandwidth BW2 is designed for optimizing the noise-related performance, and may be relatively disadvantageous on the speed of the locking operation in comparison with the bandwidth BW1, this extra time for recovering the voltage level on the node N2 may be quite long and is therefore unwanted.

Figure 2:
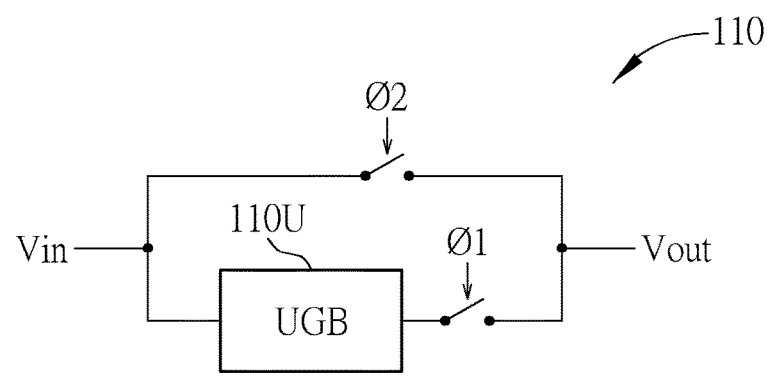
FIG. 2 is a diagram illustrating some details of a voltage buffer shown in FIG. 1 according to an embodiment of the present invention.

In the embodiment shown in FIG. 1, a voltage buffer 110 within the gear-shifting loop filter 100 may be coupled between the node N2 and the capacitor $(1-\alpha)C_2$, where FIG. 2 is a diagram illustrating some details of the voltage buffer 110 shown in FIG. 1 according to an embodiment of the present invention. An input terminal Vin and an output terminal Vout of the voltage buffer are coupled to the node N2 and the capacitor $(1-\alpha)C_2$ shown in FIG. 1, respectively, and with aid of the voltage buffer 110, a voltage level on the capacitor $\alpha C_2$ (or on the node N2) can be copied to the capacitor $(1-\alpha)C_2$ before coupling the capacitor $(1-\alpha)C_2$ to the node N2. As shown in FIG. 2, the voltage buffer 110 may comprise a unit gain buffer (UGB) 110U, a first switch controlled by a gear-shifting control signal Ø1, and a second switch controlled by the gear-shifting control signal Ø2. As shown in FIG. 2, the UGB 110U and the first switch coupled in series may represent a first signal path between an input terminal Vin and an output terminal Vout of the voltage buffer 110, and the second switch may represent a second signal path between the input terminal Vin and the output terminal Vout of the voltage buffer 110.

For better comprehension, please refer to FIG. 2 in conjunction with FIG. 1, where the input terminal Vin is coupled to the node N2, and the output terminal Vout is coupled to the capacitor $(1-\alpha)C_2$. For example, at the beginning of the locking operation, the fast-locking PLL 10 may operate under a first bandwidth mode (which relatively benefits the locking speed), where the first switch is turned on and the second switch is turned off, to enable the first signal path between the input terminal Vin and the output terminal Vout, so the voltage level on the capacitor $\alpha C_2$ (or on the node N2) can be copied to the capacitor $(1-\alpha)C_2$ by the UGB 110U at certain time point(s) before coupling the capacitor $(1-\alpha)C_2$ to the node N2; and after the locking operation is almost completed (e.g. frequency error or phase error detected by the PFD/CP 11 is less than a predetermined value, or a time period starting from the beginning of the locking operation reaches a predetermined time period), the fast-locking PLL 10 may enter a second bandwidth mode (which relatively benefits the noise-related performance) from the first bandwidth mode, where the first switch is turned off and the second switch is turned on, to enable the second signal path between the input terminal Vin and the output terminal Vout, so the capacitor $(1-\alpha)C_2$ can be coupled to the node N2, to switch the dynamic bandwidth from the bandwidth BW1 to the bandwidth BW2. In some embodiments, the UGB 110U shown in FIG. 2 may be disabled or turned off after the fast locking PLL 10 enters the second bandwidth mode from the first bandwidth mode, but the present invention is not limited thereto. As the voltage level on the capacitor $(1-\alpha)C_2$ is similar or identical to that on the capacitor $\alpha C_2$, any possible problem that may occur in an embodiment without using the voltage buffer 110 can be solved, and overall performance (e.g. the speed of the locking operation) can be optimized.

As the capacitance of the capacitor set $C_{S1}$ is fixed while performing the gear-shifting operation, phase margin of the fast-locking PLL may change. The following equations illustrate phase margin $\varnothing_{P1}$ of the fast-locking PLL 10 in the first bandwidth mode and phase margin $\varnothing_{P2}$ of the fast-locking PLL 10 in the second bandwidth mode:

$$\varphi_{P1} = 2\tan^{-1}\left(\sqrt{\frac{\alpha \times C_2}{C_1} + 1}\right) - \frac{\pi}{2}; \text{ and}$$

$$\varphi_{P2} = 2\tan^{-1}\left(\sqrt{\frac{C_2}{C_1} + 1}\right) - \frac{\pi}{2}.$$

Although the phase margin of the fast-locking PLL 10 is not fixed during the gear-shifting operation, it is allowable as long as the phase margin falls in an acceptable range which does not greatly degrade the overall performance.

In other embodiment, the phase margin can be kept unchanged with aid of switching the capacitor set $C_{S1}$ shown in FIG. 1, to optimize the overall performance of a fast-locking PLL. For better illustration, please refer to the following equations, which present a bandwidth $\omega_C$ (e.g. the bandwidth BW2 mentioned above), a zero frequency $\omega_Z$, a pole frequency $\omega_P$, and phase margin $\varphi(\omega)$ with respect to a frequency variable $\omega$ of a fast-locking PLL (e.g. the fast-locking PLL 10 shown in FIG. 1) operating under the second bandwidth mode:

$$\omega_C = \frac{I_{CP} \times K_{VCO} \times R_2}{N};$$

$$\omega_Z = \frac{1}{R_2 \times C_2};$$

$$\omega_P = \frac{1}{R_2 \times C_2}\left(1 + \frac{C_2}{C_1}\right); \text{ and}$$

$$\varphi(\omega) = \tan^{-1}\left(\frac{\omega}{\omega_Z}\right) - \tan^{-1}\left(\frac{\omega}{\omega_P}\right).$$

For the purpose of optimizing the overall performance of this fast-locking PLL, the phase margin $\varphi(\omega)$ of this fast-locking PLL operating under the first bandwidth mode is preferably the same as that operating under the second bandwidth mode. In order to keep the phase margin $\varphi(\omega)$ (i.e. making $\varphi(\omega_C)=\varphi(\omega_{C1})$, where $\omega_{C1}$ represents the bandwidth of this fast-locking PLL such as the bandwidth BW1 mentioned above), it is required to make $\omega_C/\omega_Z=\omega_{C1}/\omega_Z$ and $\omega_C/\omega_P=\omega_{C1}/\omega_P$. For example, in the first bandwidth mode, when the resistance "$R_2$" is doubled to make the bandwidth $\omega_C$ doubled (e.g. $\omega_{C1}=2\times\omega_C$), the capacitance "$C_2$" needs to be reduced to ¼, and the capacitance "$C_1$" needs to be reduced to ¼, to make $\omega_C/\omega_Z=\omega_{C1}/\omega_Z$ and $\omega_C/\omega_P=\omega_{C1}/\omega_P$.

Figure 3:
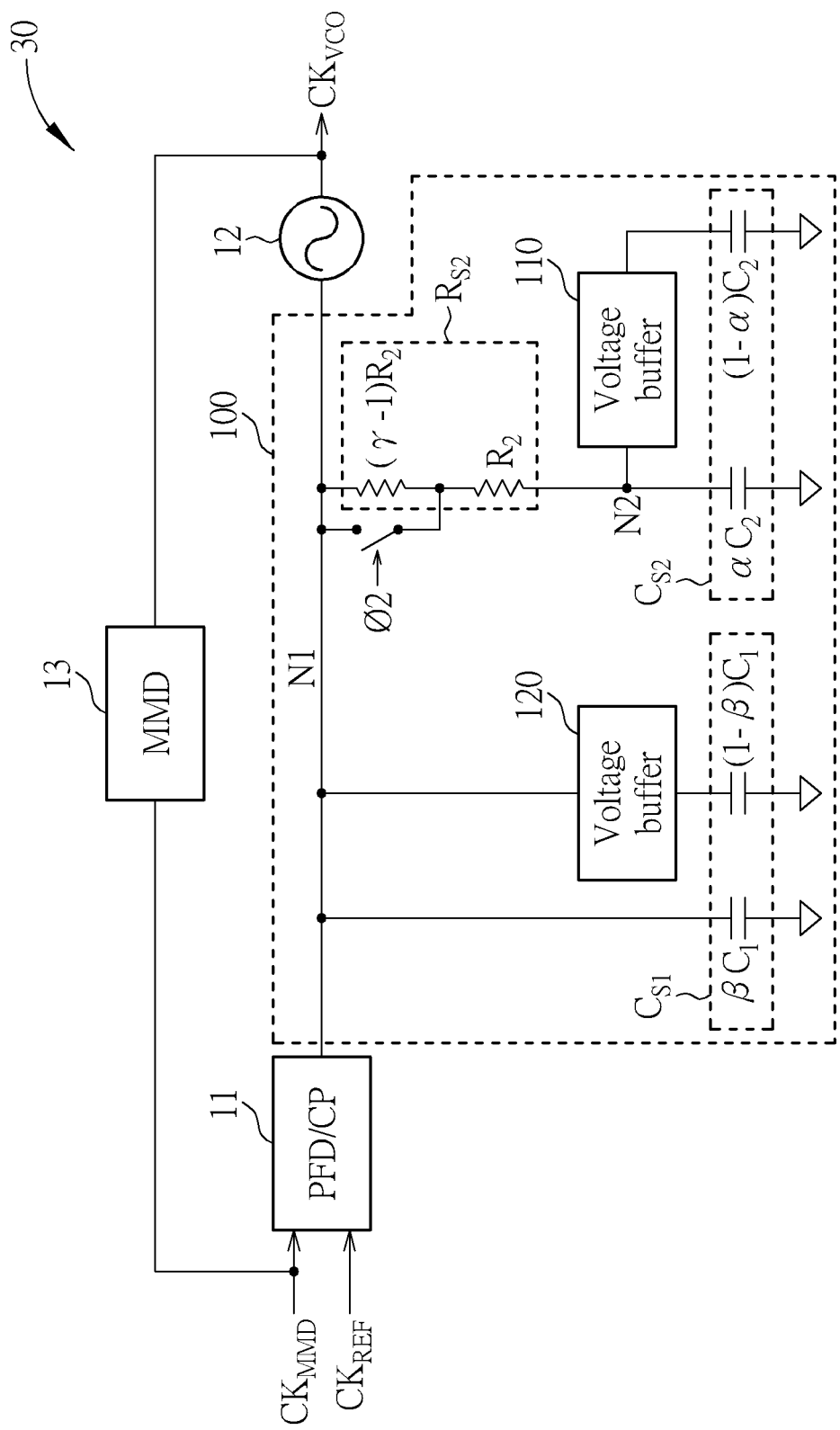
FIG. 3 is a diagram illustrating a fast-locking PLL according to an embodiment of the present invention.

FIG. 3 is a diagram illustrating a fast-locking PLL 30 according to an embodiment of the present invention, where the fast-locking PLL 30 may be obtained by modifying the architecture of the fast-locking PLL 10 shown in FIG. 1, and more particularly, by modifying implementation of the capacitor set $C_{S1}$. In the embodiment of FIG. 3, the capacitor set $C_{S1}$ may be configured to have a dynamic capacitance (e.g. either a capacitance "$\beta\times C$" or a capacitance "$C_1$"), where $\alpha=\beta=1/\gamma^2$. When the dynamic bandwidth is switched from the bandwidth BW1 to the bandwidth BW2, the dynamic capacitance of the capacitor set $C_{S1}$ can be switched from "$\beta\times C_1$" to "$C_1$", to make phase margin of the fast-locking PLL 30 unchanged during the gear-shifting operation. As shown in FIG. 3, the capacitor set $C_{S1}$ may comprise a capacitor $C_1$ (which has the capacitance "$\beta\times C$") and a capacitor $(1-\beta)C_1$ (which has a capacitance "$(1-\beta)\times C_1$"), where the capacitor $C_{S1}$ is coupled to the node N1. For example, the dynamic capacitance of the capacitor set $C_{S1}$ can be switched from "$\beta\times C$" to "$C$" by coupling the capacitor $(1-\beta)C_1$ to the node N1, to make the phase margin of the fast-locking PLL 30 unchanged.

In some embodiment, the capacitor $(1-\beta)C_1$ may be coupled to the node N1 without any processing in advance when performing the gear-shifting operation. Due to the similar reason mentioned above, this may cause some disadvantage. For example, when a locking operation of the fast-locking PLL 30 is almost completed, a voltage level on the node N1 is expected to be around a target level, where a voltage level on the capacitor $(1-\beta)C_1$ may be different from that on the node N1, and therefore the voltage level on the node N1 may be pulled away from this target level when coupling the capacitor $(1-\beta)C_1$ to the node N1. Thus, the locking operation will need to spend extra time for recovering the voltage level on the node N1 back to this target level via the bandwidth BW2. More particularly, as the bandwidth BW2 is designed for optimizing the noise-related performance, and may be relatively disadvantageous on the speed of the locking operation in comparison with the bandwidth BW1, this extra time for recovering the voltage level on the node N2 is especially unwanted. This in mind, a voltage buffer 120 within the gear-shifting loop filter 100 may be coupled between the node N1 and the capacitor $(1-\beta)C_1$ in the embodiment of FIG. 3. With aid of the voltage buffer 120, the voltage level on the capacitor $C_1$ can be copied to the capacitor $(1-\beta)C_1$ before coupling the capacitor $(1-\beta)C_1$ to the node N1. The implementation of the voltage buffer 120 may be similar or identical to the voltage buffer 110, where implementation details of the voltage buffer 120 are not repeated here for brevity, but the present invention is not limited thereto. As long as the voltage buffer 120 is capable of copying the voltage level on the capacitor $C_1$ to the capacitor $(1-\beta)C_1$ before coupling the capacitor $(1-\beta)C_1$ to the node N1, any other implementation also belongs to the scope of the present invention.

To further improve overall performance, hardware of the gear-shifting loop filter can be further modified. In practice, the voltage level on the node N1 and the voltage level on the node N2 may be substantially similar or identical to each other when the locking operation is completed or almost completed. Thus, the voltage buffer 110 and the voltage buffer 120 can share the same hardware to reduce additional costs. For better comprehension, please refer to FIG. 4, which is a diagram illustrating a fast-locking PLL 40 according to an embodiment of the present invention, where the fast-locking PLL 40 may be obtained by modifying the architecture of the fast-locking PLL 30 shown in FIG. 3, and more particularly, by merely utilizing a single voltage buffer such as a voltage buffer 130, to achieve the same function or effect as that of the voltage buffers 110 and 120. For brevity, the dashed boxes labeled $C_{S1}$, $C_{S2}$ and $R_{S2}$ are omitted in FIG. 4. In this embodiment, with aid of the voltage buffer 130, the voltage level on the capacitor $\alpha C_2$ (or the node N2) can be copied to both of the capacitors $(1-\alpha)C_2$ and $(1-\beta)C_1$ before respectively coupling the capacitors $(1-\alpha)C_2$ and $(1-\beta)C_1$ to the nodes N2 and N1.

Figure 4:
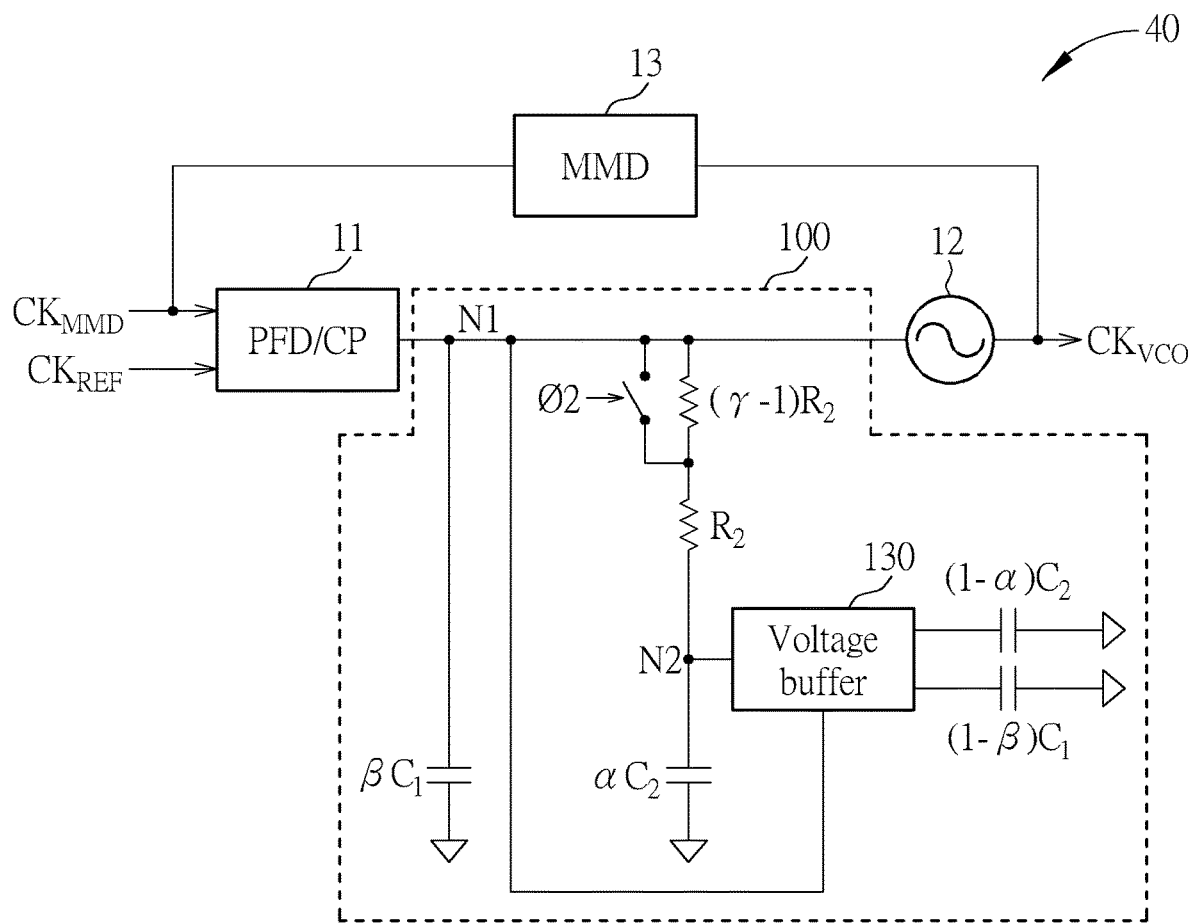
FIG. 4 is a diagram illustrating a fast-locking PLL according to an embodiment of the present invention.
Figure 5:
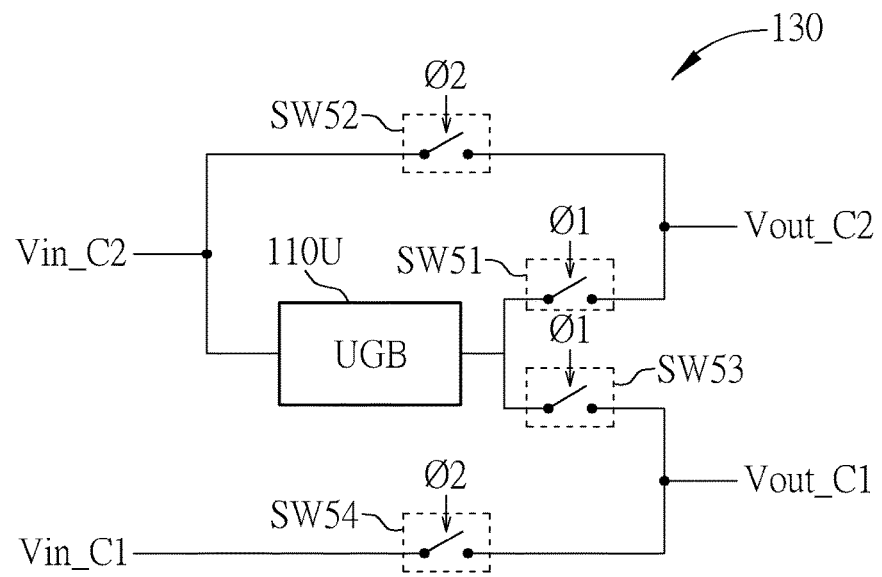
FIG. 5 is a diagram illustrating some details of a voltage buffer shown in FIG. 4 according to an embodiment of the present invention.

FIG. 5 is a diagram illustrating some details of the voltage buffer 130 shown in FIG. 4 according to an embodiment of the present invention. The voltage buffer 130 may be obtained by modifying the voltage buffer 110 shown in FIG. 2. As shown in FIG. 5, in addition to the UGB 110U, the first switch (which is labeled "SW51" in FIG. 5 for better comprehension) controlled by the gear-shifting control signal Ø1, and the second switch (which is labeled "SW52" in FIG. 5 for better comprehension) controlled by the gear-shifting control signal Ø2, the voltage buffer 130 may further comprise a third switch (which is labeled "SW53" in FIG. 5 for better comprehension) controlled by the gear-shifting control signal Ø1 and a fourth switch (which is labeled "SW54" in FIG. 5 for better comprehension) controlled by the gear-shifting control signal Ø2. In detail, the UGB 110U and the first switch coupled in series may represent a first signal path between an input terminal Vin_C2 and an output terminal Vout_C2 of the voltage buffer 130, the second switch may represent a second signal path between the input terminal Vin_C2 and the output terminal Vout_C2 of the voltage buffer 130, the UGB 110U and the third switch coupled in series may represent a third signal path between the input terminal Vin_C2 and an output terminal Vout_C1 of the voltage buffer 130, and the fourth switch may represent a fourth signal path between the input terminal Vin_C1 and the output terminal Vout_C1 of the voltage buffer 130.

For better comprehension, please refer to FIG. 5 in conjunction with FIG. 1. In the embodiment of FIG. 4, the input terminal Vin_C2 is coupled to the node N2, the input terminal Vin_C1 is coupled to the node N1, the output terminal Vout_C2 is coupled to the capacitor $(1-\alpha)C_2$, and the output terminal Vout_C1 is coupled to the capacitor $(1-\beta)C_1$. For example, at the beginning of the locking operation, the fast-locking PLL 40 may operate under the first bandwidth mode (which relatively benefits the locking speed), where the second switch and the fourth switch are turned off, the first switch is turned on to enable the first signal path between the input terminal Vin_C2 and the output terminal Vout_C2, and the third switch is turned on to enable the third signal path between the input terminal Vin_C2 and the output terminal Vout_C1, so the voltage level on the capacitor $\alpha C_2$ (or on the node N2) can be copied to both of the capacitors $(1-\alpha)C_2$ and $(1-\beta)C_1$ by the UGB 110U at certain time point(s) before respectively coupling the capacitors $(1-\alpha)C_2$ and $(1-\beta)C_1$ to the nodes N2 and N1; and after the locking operation is almost completed (e.g. frequency error or phase error detected by the PFD/CP 11 is less than a predetermined value, or a time period starting from the beginning of the locking operation reaches a predetermined time period), the fast-locking PLL 40 may enter the second bandwidth mode (which relatively benefits the noise-related performance) from the first bandwidth mode, where the first switch and the third switch are turned off, the second switch is turned on to enable the second signal path between the input terminal Vin_C2 and the output terminal Vout_C2, and the fourth switch is turned on to enable the fourth signal path between the input terminal Vin_C1 and the output terminal Vout_C1, so the capacitors $(1-\alpha)C_2$ and $(1-\beta)C_1$ can be coupled to the nodes N2 and N1, respectively, to switch the dynamic bandwidth from the bandwidth BW1 to the bandwidth BW2. In some embodiments, the UGB 110U shown in FIG. 5 may be disabled or turned off after the fast locking PLL 40 enters the second bandwidth mode from the first bandwidth mode, but the present invention is not limited thereto.

As long as the capacitors $(1-\alpha)C_2$ and $(1-\beta)C_1$ can obtain the voltage levels of the nodes N2 and/or N1 with aid of the voltage buffer 130, connection of the voltage buffer 130 in the gear-shifting loop filter 100 may vary. For example, the input terminal Vin_C2, the input terminal Vin_C1, the output terminal Vout_C2 and the output terminal Vout_C1 of the voltage buffer 130 shown in FIG. 5 may be coupled to the node N2, the node N1, the capacitor $(1-\alpha)C_2$ and the capacitor $(1-\beta)C_1$, respectively, as shown in FIG. 4, but the present invention is not limited thereto. In another example, the input terminal Vin_C2, the input terminal Vin_C1, the output terminal Vout_C2 and the output terminal Vout_C1 of the voltage buffer 130 shown in FIG. 5 may be coupled to the node N1, the node N2, the capacitor $(1-\beta)C_1$ and the capacitor $(1-\alpha)C_2$, respectively, since the voltage level on the node N1 may be substantially similar or identical to the voltage level on the node N2 when the locking operation is completed or almost completed (which corresponds to the time point of performing the gear-shifting operation), but the present invention is not limited thereto.

Figure 6:
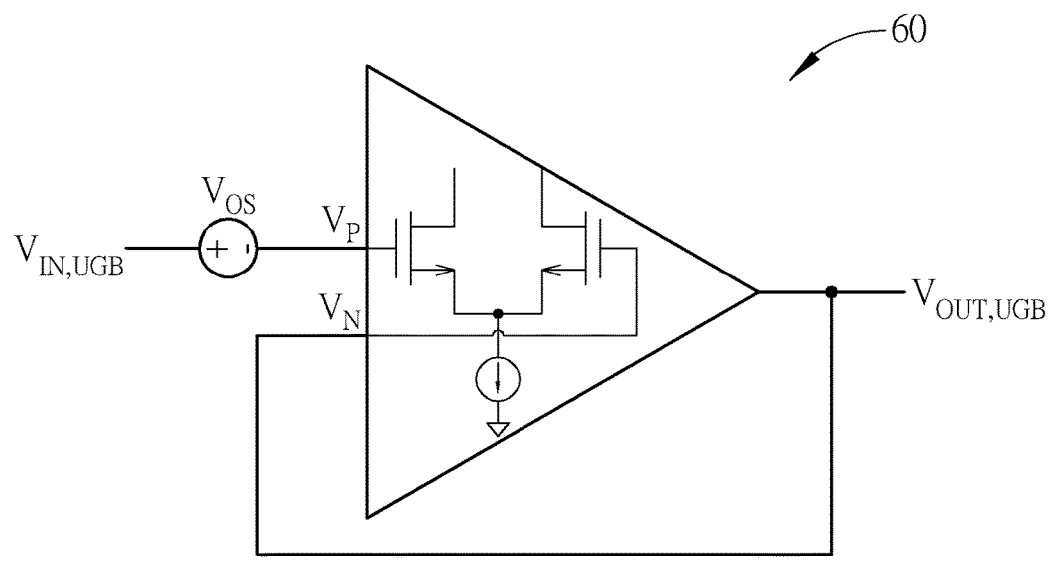
FIG. 6 is a diagram illustrating a unit gain buffer (UGB) according to an embodiment of the present invention.
Figure 7:
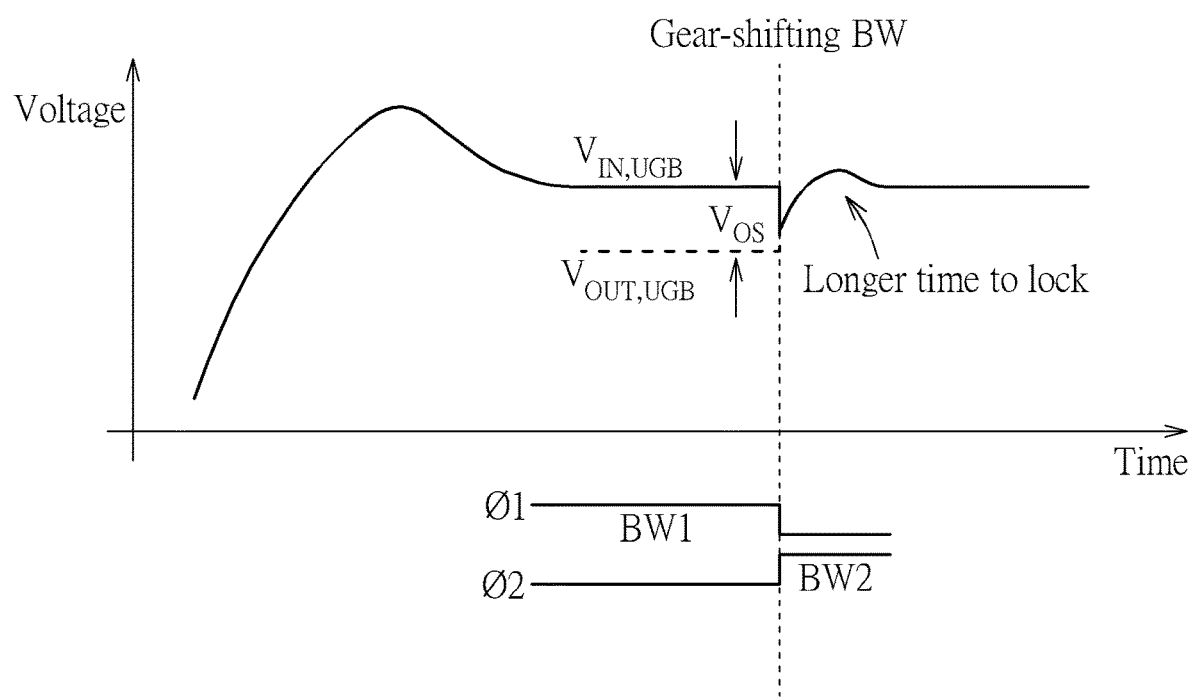
FIG. 7 illustrates waveforms of an input voltage and an output voltage of a UGB in conjunction with timing of gear-shifting control signals according to an embodiment of the present invention.

FIG. 6 is a diagram illustrating an UGB 60 according to an embodiment of the present invention, where the UGB 60 is implemented by an operational amplifier with negative feedback configuration, and may be an example of the UGB 110U, but the present invention is not limited thereto. In practice, the operational amplifier may has some non-ideal effect (e.g. non-linearity) such as a finite gain (e.g. finite voltage gain) and mismatch; for example, input terminals $V_P$ and $V_N$ or input components (e.g. input stage transistors) of the operational amplifier may not be completely identical to each other due to process variation. In view of the above, the operational amplifier may have an offset voltage $V_{OS}$ (may correspond to a voltage difference between an input voltage $V_{IN,UGB}$ and an output voltage $V_{OUT,UGB}$ of the UGB 110U, e.g. $V_{OUT,UGB}=V_{IN,UGB}+V_{OS}$) caused by the finite gain and/or input mismatch of the operational amplifier, and at the moment of the gear-shifting operation (the moment at which the gear-shifting control signal Ø1 turns to low and the gear-shifting control signal Ø2 turns to high, illustrated by a dashed line labeled "Gear-shifting BW"), the offset voltage $V_{OS}$ may pull the voltage level on any of the nodes N1 and N2 (e.g. $V_{IN,UGB}$) away from a target level which is obtained before the gear-shifting operation as shown in FIG. 7, so the locking operation needs to spend extra time to pull back the voltage level to this target level (e.g. spend longer time to lock). In order to minimize the impact of the offset voltage $V_{OS}$ when implementation of the UGB 110U shown in FIG. 6 is applied, specification requirement of the operational amplifier may be extremely high, e.g. a high direct-current (DC) gain, large sizes of input components (e.g. large dimensions of channel width and/or channel length of input transistors may be required), in order to reduce the offset voltage $V_{OS}$, and this may greatly increase overall costs. More particularly, to guarantee that a transconductance of the operational amplifier is large enough, the ratio of the channel width and the channel length needs to be large enough, which means both the dimensions of the channel width and the channel length need to be increased in order to minimize the offset voltage $V_{OS}$ without sacrificing the transconductance.

Figure 8:
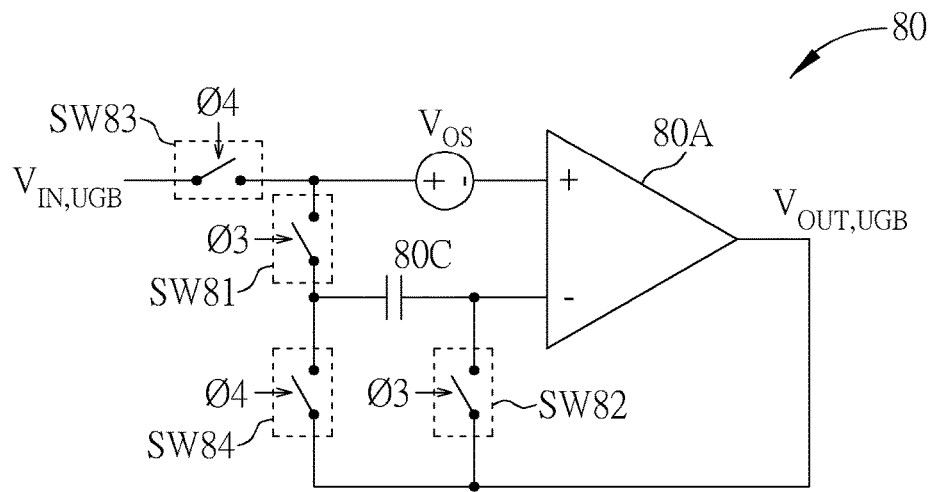
FIG. 8 is a diagram illustrating an auto-zero UGB according to an embodiment of the present invention.

FIG. 8 is a diagram illustrating an auto-zero UGB 80 according to an embodiment of the present invention, where the auto-zero UGB 80 may be an example of the UGB 110U, but the present invention is not limited thereto. As shown in FIG. 8, the auto-zero UGB 80 may comprise an amplifier circuit 80A (e.g. an operational amplifier) and a storage capacitor 80C coupled to the amplifier circuit 80A, where the amplifier circuit 80A may have an offset voltage (e.g. $V_{OS}$) caused by a finite gain or input mismatch of the amplifier circuit 80A, and the storage capacitor 80C may be configured to store the offset voltage $V_{OS}$. For example, the auto-zero UGB 80 may operate under a calibration mode and a buffer mode, alternately, where in the calibration mode of the auto-zero UGB 80, the offset voltage $V_{OS}$ can be stored on the storage capacitor 80C; and in the buffer mode of the auto-zero UGB 80, an input voltage level on an input terminal (e.g. the input voltage $V_{IN,UGB}$) of the auto-zero UGB is copied to an output terminal of the auto-zero UGB to be the output voltage $V_{OUT,UGB}$. More specifically, the auto-zero UGB 80 may comprise a first control switch (which is labeled "SW81" in FIG. 8 for better comprehension) and a second control switch (which is labeled "SW82" in FIG. 8 for better comprehension) controlled by a mode control signal Ø3, and further comprise a third control switch (which is labeled "SW83" in FIG. 8 for better comprehension) and a fourth control switch (which is labeled "SW84" in FIG. 8 for better comprehension) controlled by a mode control signal Ø4. In detail, the first control switch is coupled between a first input terminal (which is labeled "+" in FIG. 8) of the amplifier circuit 80A and a first end of the storage capacitor 80C, the second control switch is coupled between an output terminal of the amplifier circuit 80A (which is coupled to the output terminal of the auto-zero UGB 80) and a second input terminal (which is labeled "−" in FIG. 8), the third control switch is coupled between the input terminal of the auto-zero UGB and the first input terminal of the amplifier circuit 80A, and the fourth control switch is coupled between the first end of the storage capacitor 80C and the output terminal of the amplifier circuit 80A, where a second end of the storage capacitor 80C is coupled to the second input terminal of the amplifier circuit 80A.

Figure 9:
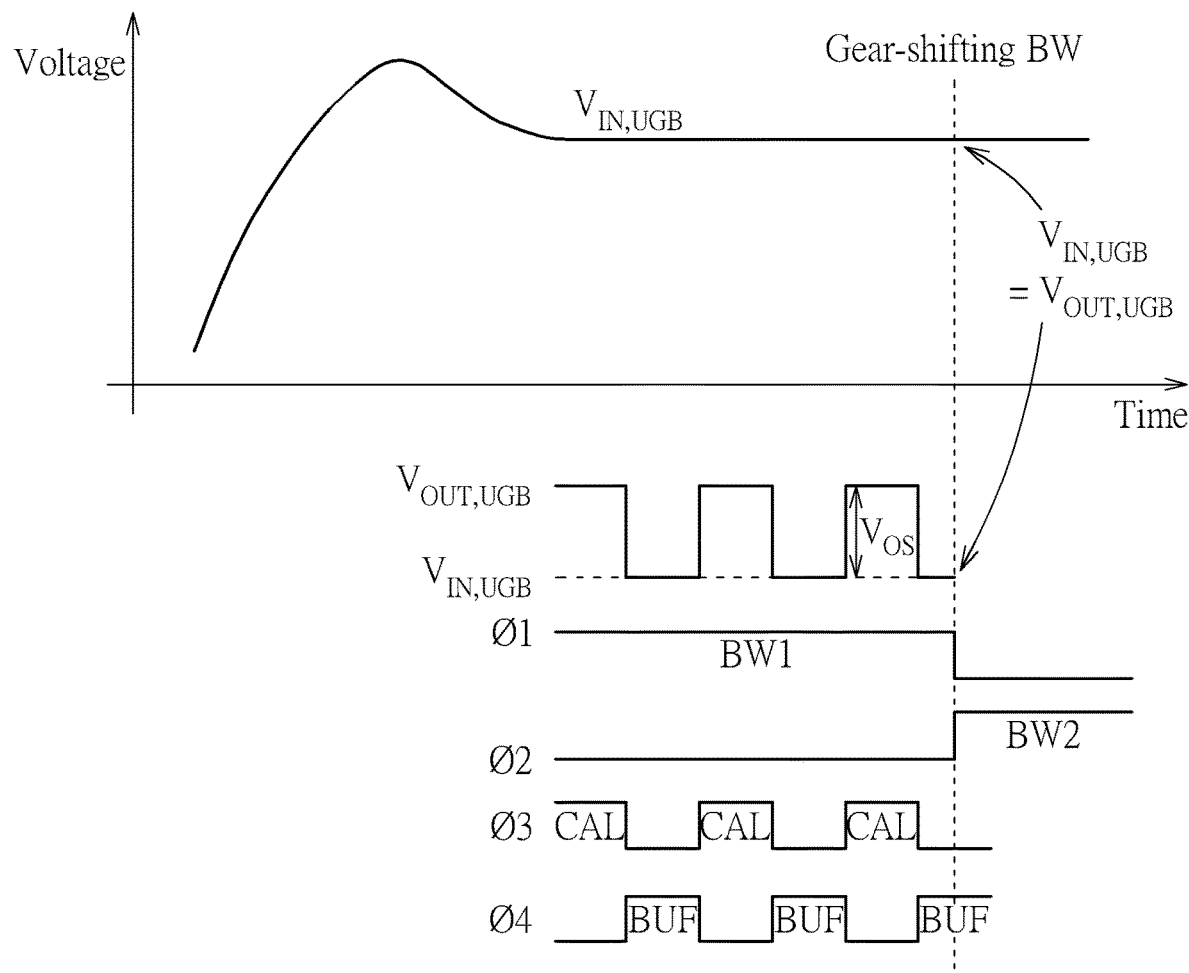
FIG. 9 illustrates waveforms of an input voltage and an output voltage of an auto-zero UGB in conjunction with timing of gear-shifting control signals and mode control signals of the auto-zero UGB according to an embodiment of the present invention.

FIG. 9 illustrates waveforms of the input voltage $V_{IN,UGB}$ (or the voltage level on any of the nodes N1 and N2) and the output voltage $V_{OUT,UGB}$ in conjunction with timing of the gear-shifting control signals {Ø1, Ø2} and the mode control signals {Ø3, Ø4} according to an embodiment of the present invention. For better comprehension, please refer to FIG. 9 in conjunction with FIG. 8. When the mode control signal Ø3 is high (e.g. having a logic value "1") and the mode control signal Ø4 is low (e.g. having a logic value "0"), the first control switch and the second control switch are turned on, and the third control switch and the fourth control switch are turned off, where the auto-zero UGB 80 may operate under the calibration mode (labeled "CAL"). In the calibration mode, the storage capacitor 80C is coupled between the first input terminal and the second input terminal of the amplifier circuit 80A, and an output terminal of the amplifier circuit is coupled to the second input terminal of the amplifier circuit, to store the offset voltage $V_{OS}$ on the storage capacitor 80C. When the mode control signal Ø4 is high and the mode control signal Ø3 is low, the third control switch and the fourth control switch are turned on, and the first control switch and the second control switch are turned off, where the auto-zero UGB 80 may operate under the buffer mode (labeled "BUF"). In the buffer mode, the input terminal of the auto-zero UGB 80 is coupled to the first input terminal of the amplifier circuit 80A, and the storage capacitor 80C is coupled between the second input terminal of the amplifier circuit 80A and the output terminal of the auto-zero UGB 80, to copy the input voltage level on the input terminal of the auto-zero UGB 80 to the output terminal of the auto-zero UGB (e.g. $V_{IN,UGB}=V_{OUT,UGB}$). It should be note that a time point of the dynamic bandwidth being switched from the bandwidth BW1 to the bandwidth BW2 (e.g. the time point of performing the gear-shifting operation, which is labeled "Gear-shifting BW" in FIG. 9) is in a period at which the auto-zero UGB operates in the buffer mode. In comparison with the embodiment shown in FIG. 7, as the offset voltage $V_{OS}$ can be canceled or reduced on the output terminal of the auto-zero UGB 80, the speed of the locking operation can be improved.

It should be noted that the connection shown in FIG. 8 is for illustrative purpose only, and is not meant to be a limitation of the present invention. As long as the auto-zero UGB 80 can cancel the impact of the offset voltage $V_{OS}$ to make $V_{IN,UGB}=V_{OUT,UGB}$, detailed circuit implementation of the auto-zero UGB 80 may vary.

Figure 10:
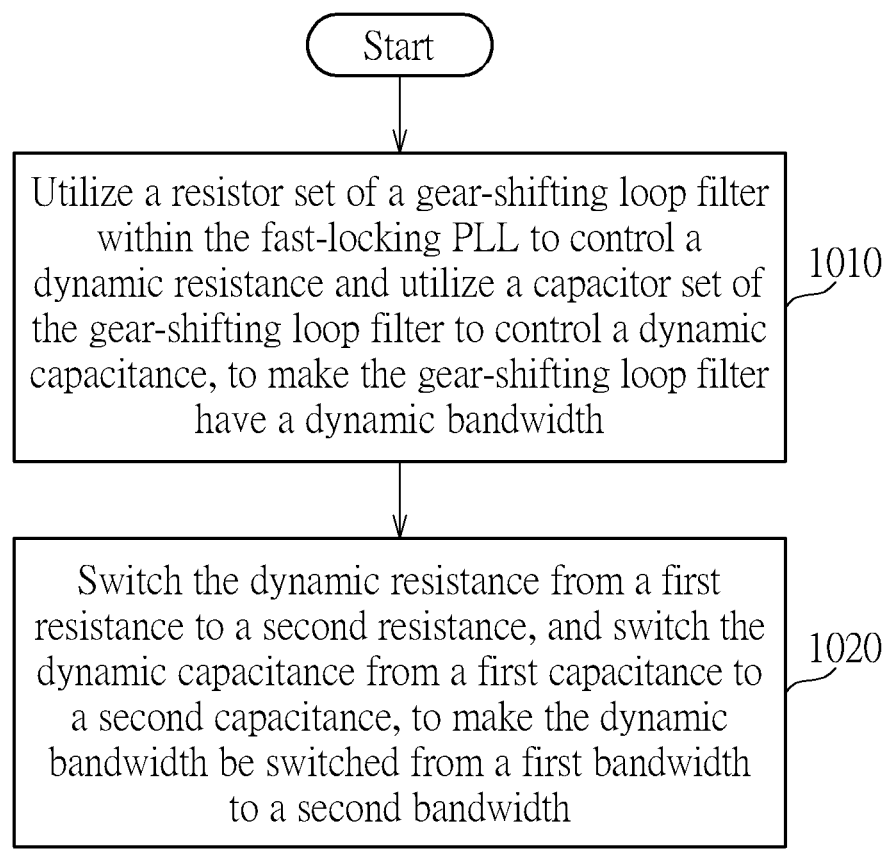
FIG. 10 is a working flow illustrating a fast-locking method of a fast-locking PLL according to an embodiment of the present invention.

FIG. 10 is a working flow illustrating a fast-locking method of a fast-locking PLL (e.g. any of the fast-locking PLLs 10, 30 and 40) according to an embodiment of the present invention. It should be noted that the working flow shown in FIG. 10 is for illustrative purposes only, and is not meant to be a limitation of the present invention. One or more steps may be added, deleted or modified in the working flow shown in FIG. 10. In addition, if a same result may be obtained, these steps do not have to be executed in the exact order shown in FIG. 10.

In Step 1010, the fast-locking PLL may utilize a resistor set of a gear-shifting loop filter within the fast-locking PLL to control a dynamic resistance and utilize a capacitor set of the gear-shifting loop filter to control a dynamic capacitance, to make the gear-shifting loop filter have a dynamic bandwidth.

In Step 1020, the fast-locking PLL may switch the dynamic resistance from a first resistance to a second resistance, and switch the dynamic capacitance from a first capacitance to a second capacitance, to make the dynamic bandwidth be switched from a first bandwidth to a second bandwidth.

Briefly summarized, the fast-locking PLL and the associated fast-locking method provided by the embodiments of the present invention can switch resistor(s) and capacitor(s) within a loop filter within the fast-locking PLL, to utilized different bandwidths for different periods of a locking operation, thereby optimizing the overall performance. As at least one voltage buffer may be required for the proposed gear-shifting operation, and any offset voltage of an amplifier circuit within the voltage buffer may impact the overall performance of the fast-lock PLL, an auto-zero UGB is provided in order to guarantee an input voltage and an output voltage of the voltage buffer is identical or almost identical without being hindered by any offset. In comparison with the related art, the embodiments of the present invention will not greatly increase additional costs. Thus, the present invention can improve the overall performance without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fast-locking phase-locked loop (PLL), comprising:
    a gear-shifting loop filter, configured to have a dynamic bandwidth, wherein the gear-shifting loop filter comprising:
        a resistor set, configured to have a dynamic resistance;
        a capacitor set, coupled to the resistor set, configured to have a dynamic capacitance, wherein the capacitor set comprises a first capacitor and a second capacitor; and
        a voltage buffer, configured to copy a voltage level on the first capacitor to the second capacitor;
    wherein the dynamic resistance is switched from a first resistance to a second resistance and the dynamic capacitance is switched from a first capacitance to a second capacitance, to make the dynamic bandwidth be switched from a first bandwidth to a second bandwidth.

2. The fast-locking PLL of claim 1, wherein the gear-shifting loop filter further comprises:
    another capacitor set, coupled to the resistor set, configured to have another dynamic capacitance;
    wherein when the dynamic bandwidth is switched from the first bandwidth to the second bandwidth, said another dynamic capacitance is switched from another first capacitance to another second capacitance, to make phase margin of the fast-locking PLL unchanged.

3. The fast-locking PLL of claim 2, wherein the first resistance is γ times the second resistance, the first capacitance is α times the second capacitance, and said another first capacitance is β times another second capacitance, to make the first bandwidth be γ times the second bandwidth and the phase margin of the fast-locking PLL be unchanged, wherein $\alpha=\beta=1/\gamma^2$, and γ is a positive value greater than one.

4. The fast-locking PLL of claim 1, wherein the resistor set is coupled between a first common node and a second common node of the gear-shifting loop filter, the first capacitor is coupled to the resistor set via the second common node, and the dynamic capacitance is switched from the first capacitance to the second capacitance by coupling the second capacitor to the second common node, wherein the voltage level on the first capacitor is copied to the second capacitor before coupling the second capacitor to the second common node.

5. The fast-locking PLL of claim 4, wherein the gear-shifting loop filter further comprises:
    another capacitor set, coupled to the resistor set, configured to have another dynamic capacitance, wherein said another capacitor set comprises another first capacitor and another second capacitor, and said another first capacitor is coupled to the first common node;
    wherein when the dynamic bandwidth is switched from the first bandwidth to the second bandwidth, said another dynamic capacitance is switched from another first capacitance to another second capacitance by coupling said another second capacitor to the first common node, to make phase margin of the fast-locking PLL unchanged.

6. The fast-locking PLL of claim 5, wherein with aid of the voltage buffer, the voltage level on the first capacitor is copied to said another second capacitor before coupling said another second capacitor to the first common node.

7. The fast-locking PLL of claim 5, wherein with aid of another voltage buffer within the gear-shifting loop filter, another voltage level on said another first capacitor is copied to said another second capacitor before coupling said another second capacitor to the first common node.

8. The fast-locking PLL of claim 4, wherein the voltage buffer comprises:
an auto-zero unit gain buffer (UGB), comprising:
an amplifier circuit, having an offset voltage caused by a finite gain or input mismatch of the amplifier circuit;
a storage capacitor, coupled to the amplifier circuit, configured to store the offset voltage;
wherein in a calibration mode of the auto-zero UGB, the offset voltage is stored on the storage capacitor; and in a buffer mode of the auto-zero UGB, an input voltage level on an input terminal of the auto-zero UGB is copied to an output terminal of the auto-zero UGB.

9. The fast-locking PLL of claim 8, wherein:
in the calibration mode, the storage capacitor is coupled between a first input terminal and a second input terminal of the amplifier circuit, and an output terminal of the amplifier circuit is coupled to the second input terminal of the amplifier circuit; and
in the buffer mode, the input terminal of the auto-zero UGB is coupled to the first input terminal of the amplifier circuit, and the storage capacitor is coupled between the second input terminal of the amplifier circuit and the output terminal of the auto-zero UGB;
wherein the output terminal of the auto-zero UGB is coupled to the output terminal of the amplifier circuit.

10. The fast-locking PLL of claim 8, wherein a time point of the dynamic bandwidth being switched from the first bandwidth to the second bandwidth is in a period at which the auto-zero UGB operates in the buffer mode.

11. A fast-locking method of a fast-locking phase-locked loop (PLL), comprising:
utilizing a resistor set of a gear-shifting loop filter within the fast-locking PLL to control a dynamic resistance and utilizing a capacitor set of the gear-shifting loop filter to control a dynamic capacitance, to make the gear-shifting loop filter have a dynamic bandwidth, wherein the capacitor set comprises a first capacitor and a second capacitor;
with aid of a voltage buffer within the gear-shifting loop filter, copying a voltage level on the first capacitor to the second capacitor; and
switching the dynamic resistance from a first resistance to a second resistance, and switching the dynamic capacitance from a first capacitance to a second capacitance, to make the dynamic bandwidth be switched from a first bandwidth to a second bandwidth.

12. The fast-locking method of claim 11, wherein the gear-shifting loop filter further comprises another capacitor set having another dynamic capacitance, and the fast-locking method further comprising:
in response to the dynamic bandwidth being switched from the first bandwidth to the second bandwidth, switching said another dynamic capacitance from another first capacitance to another second capacitance, to make phase margin of the fast-locking PLL unchanged.

13. The fast-locking method of claim 12, wherein the first resistance is $\gamma$ times the second resistance, the first capacitance is $\alpha$ times the second capacitance, and said another first capacitance is $\beta$ times another second capacitance, to make the first bandwidth be $\gamma$ times the second bandwidth and the phase margin of the fast-locking PLL be unchanged, wherein $\alpha=\beta=1/\gamma^2$, and $\gamma$ is a positive value greater than one.

14. The fast-locking method of claim 11, wherein the resistor set is coupled between a first common node and a second common node of the gear-shifting loop filter, the first capacitor is coupled to the resistor set via the second common node, and the step of switching the dynamic capacitance from the first capacitance to the second capacitance comprises:
after the voltage level on the first capacitor is copied to the second capacitor, coupling the second capacitor to the second common node.

15. The fast-locking method of claim 14, further comprising:
utilizing another capacitor set of the gear-shifting loop filter to control another dynamic capacitance, wherein said another capacitor set comprises another first capacitor and another second capacitor, and said another first capacitor is coupled to the first common node; and
in response to the dynamic bandwidth being switched from the first bandwidth to the second bandwidth, switching said another dynamic capacitance from another first capacitance to another second capacitance by coupling said another second capacitor to the first common node, to make phase margin of the fast-locking PLL unchanged.

16. The fast-locking method of claim 15, wherein the step of switching said another dynamic capacitance from said another first capacitance to said another second capacitance further comprises:
with aid of the voltage buffer, copying the voltage level on the first capacitor to said another second capacitor before coupling said another second capacitor to the first common node.

17. The fast-locking method of claim 15, wherein the step of switching said another dynamic capacitance from said another first capacitance to said another second capacitance further comprises:
with aid of another voltage buffer within the gear-shifting loop filter, copying another voltage level on said another first capacitor to said another second capacitor before coupling said another second capacitor to the first common node.

18. The fast-locking method of claim 14, wherein the voltage buffer comprises an auto-zero unit gain buffer (UGB), the auto-zero UGB comprises an amplifier circuit and a storage capacitor coupled to the amplifier circuit, and the step of copying the voltage level on the first capacitor to the second capacitor comprises:
in a calibration mode of the auto-zero UGB, storing an offset voltage of the amplifier circuit on the storage capacitor, wherein the offset voltage is caused by a finite gain or input mismatch of the amplifier circuit; and
in a buffer mode of the auto-zero UGB, copying an input voltage level on an input terminal of the auto-zero UGB to an output terminal of the auto-zero UGB, wherein the input voltage level represents the voltage level on the first capacitor.

19. The fast-locking method of claim 18, wherein:
- in the calibration mode, the storage capacitor is coupled between a first input terminal and a second input terminal of the amplifier circuit, and an output terminal of the amplifier circuit is coupled to the second input terminal of the amplifier circuit; and
- in the buffer mode, the input terminal of the auto-zero UGB is coupled to the first input terminal of the amplifier circuit, and the storage capacitor is coupled between the second input terminal of the amplifier circuit and the output terminal of the auto-zero UGB;
- wherein the output terminal of the auto-zero UGB is coupled to the output terminal of the amplifier circuit.

20. The fast-locking method of claim 18, wherein a time point of the dynamic bandwidth being switched from the first bandwidth to the second bandwidth is in a period at which the auto-zero UGB operates in the buffer mode.

* * * * *